(12) United States Patent
Li et al.

(10) Patent No.: US 12,209,311 B2
(45) Date of Patent: Jan. 28, 2025

(54) HIGH-THROUGHPUT VAPOR DEPOSITION APPARATUS AND VAPOR DEPOSITION METHOD

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Weimin Li, New York, NY (US); Wenjie Yu, Shanghai (CN); Lei Zhu, Shanghai (CN); Yiying Wang, Shanghai (CN)

(73) Assignee: SHANGHAI INSTITUTE OF MICROSYSTEM AND INFORMATION TECHNOLOGY, CHINESE ACADEMY OF SCIENCES, Shanghai (CN)

( * ) Notice: Subject to any disclaimer, the term of this patent is extended or adjusted under 35 U.S.C. 154(b) by 267 days.

(21) Appl. No.: 17/635,389

(22) PCT Filed: Nov. 21, 2019

(86) PCT No.: PCT/CN2019/119929
§ 371 (c)(1),
(2) Date: Feb. 15, 2022

(87) PCT Pub. No.: WO2021/031425
PCT Pub. Date: Feb. 25, 2021

(65) Prior Publication Data
US 2022/0290298 A1 Sep. 15, 2022

(30) Foreign Application Priority Data

Aug. 16, 2019 (CN) .......................... 201910759403.7

(51) Int. Cl.
*C23C 16/458* (2006.01)
*C23C 16/455* (2006.01)

(52) U.S. Cl.
CPC .... *C23C 16/4584* (2013.01); *C23C 16/45563* (2013.01)

(58) Field of Classification Search
CPC .......... C23C 16/45519; C23C 16/4584; C23C 16/45563; C23C 16/45565; C23C 16/04; C23C 16/45574
See application file for complete search history.

(56) References Cited

U.S. PATENT DOCUMENTS 9,175,391 B2    11/2015   Endo et al.
2003/0181060 A1*   9/2003   Asai .................... C23C 16/4405
                                                       438/758

(Continued)

FOREIGN PATENT DOCUMENTS

| CN | 1726300 Y | 1/2006 |
| CN | 1780936 A | 5/2006 |

(Continued)

*Primary Examiner* — Joseph A Miller, Jr.
(74) *Attorney, Agent, or Firm* — APRTOP LLC

(57) ABSTRACT

The present invention provides a high-throughput vapor deposition apparatus and a vapor deposition method. A rotary workbench (2) is located in a reaction chamber (1); a gas introduction device (3) is located in the reaction chamber (1) and above the rotary workbench (2); a plurality of through holes (31) is provided on the gas introduction device (3); a gas isolation structure (4) divides an upper chamber (11) into an isolation gas chamber (111) and a reaction gas chamber (112) which are isolated from each other; an isolation gas is introduced into the isolation gas chamber (111) via an isolation gas introduction channel (5), and a reaction gas is introduced into the reaction gas chamber (112) via a reaction gas introduction channel (6), for carrying out thin film deposition on an area of a substrate (Continued)

corresponding to the reaction gas chamber (112). The high-throughput vapor deposition apparatus only requires one isolation gas supply system and one reaction gas isolation system, a total of two systems, and thus is simple in structure, easy to implement, and good in isolation.

7 Claims, 2 Drawing Sheets

(56) References Cited

U.S. PATENT DOCUMENTS

| | | | |
|---|---|---|---|
| 2008/0188013 A1* | 8/2008 | Cho | H01J 37/32935 156/345.24 |
| 2011/0226181 A1 | 9/2011 | Yamamoto | |
| 2012/0315396 A1* | 12/2012 | Endo | H01J 37/3244 118/723 R |
| 2015/0179487 A1* | 6/2015 | Chen | H01L 21/67207 438/761 |
| 2016/0027674 A1 | 1/2016 | Griffin et al. | |
| 2016/0273105 A1 | 9/2016 | De Ridder et al. | |
| 2017/0121820 A1 | 5/2017 | Chung et al. | |
| 2020/0118849 A1* | 4/2020 | Fukada | C30B 25/14 |

FOREIGN PATENT DOCUMENTS

| | | |
|---|---|---|
| CN | 101962751 A | 2/2011 |
| CN | 102127757 A | 7/2011 |
| CN | 103014846 A | 4/2013 |
| CN | 106032572 A | 10/2016 |
| CN | 106158569 A | 11/2016 |
| CN | 107686984 A | 2/2018 |
| CN | 110408910 | 11/2019 |
| JP | S6294942 A | 5/1987 |
| JP | S6311672 A | 1/1988 |
| JP | 2009516777 A | 4/2009 |
| JP | 2011012331 A | 1/2011 |
| JP | 2011190519 A | 9/2011 |
| JP | 2019009264 A | 1/2019 |
| KR | 1020080075198 A | 8/2008 |
| WO | 2017204622 A | 11/2017 |

* cited by examiner

HIGH-THROUGHPUT VAPOR DEPOSITION APPARATUS AND VAPOR DEPOSITION METHOD

CROSS REFERENCE TO RELATED APPLICATION

The present application claims the benefit of priority to Chinese Patent Application No. CN 201910759403.7, entitled "HIGH-THROUGHPUT VAPOR DEPOSITION APPARATUS AND VAPOR DEPOSITION METHOD", filed with CNIPA on Aug. 16, 2019, the disclosure of which is incorporated herein by reference in its entirety for all purposes.

FIELD OF TECHNOLOGY

The present invention relates to the technical field of vapor deposition, and particularly to a high-throughput vapor deposition apparatus and a vapor deposition method.

BACKGROUND

High-throughput vapor deposition (including CVD or ALD) apparatuses are available to prepare multi-element thin film materials, by which a large number of element components are combined in a short time, to facilitate a more comprehensive study on a multi-element material system, and the selection of an optimum combination of components according to the needs of application, thus reducing the cost in material research and development.

In an existing high-throughput vapor deposition apparatus, an insulation gas is generally used to isolate multiple micro-zones, to carry out reactive deposition experiments by introducing a different gas to each micro-zone at the same time. However, the existing high-throughput vapor deposition apparatus requires the design and manufacture of more than two gas supply systems, and thus has complex structure, and difficulty in practical application.

SUMMARY

In view of the shortcomings in the prior art described above, an object of the present invention is to provide a high-throughput vapor deposition apparatus and a vapor deposition method, to solve the problem in the prior art that the existing high-throughput vapor deposition apparatus requires the design and manufacture of more than two gas introduction systems, and thus has complex structure, and difficulty in practical application.

To achieve the above and other related objects, the present invention provides a high-throughput vapor deposition apparatus. The high-throughput vapor deposition apparatus includes:
a reaction chamber;
a rotary workbench, located in the reaction chamber, and used to support a substrate and drive the substrate to rotate;
a gas introduction device, located in the reaction chamber and above the rotary workbench, and spaced from the rotary workbench by a distance, wherein the gas introduction device divides the reaction chamber into an upper chamber and a lower chamber, and a plurality of through holes is provided on the gas introduction device to bring the upper chamber and the lower chamber into communication;
a gas isolation structure, located in the upper chamber, and dividing the upper chamber into an isolation gas chamber and a reaction gas chamber which are isolated from each other, wherein a center of the gas introduction device is located outside the reaction gas chamber, and the plurality of through holes respectively allows the isolation gas chamber and the reaction gas chamber to communicate with the lower chamber;
an isolation gas introduction channel, located on a wall of the reaction chamber and communicating with the isolation gas chamber; and
a reaction gas introduction channel, located on a wall of the reaction chamber and communicating with the reaction gas chamber.

Optionally, the area of the reaction gas chamber at the bottom is smaller than the area of the isolation gas chamber at the bottom.

Optionally, a center of the gas introduction device corresponds to the center of the rotary workbench in a vertical direction.

Optionally, the gas isolation structure includes
a first gas isolation plate, having one end in contact with an inner wall of the reaction chamber, and the other end extending into the upper chamber;
a second gas isolation plate, having one end in contact with an inner wall of the reaction chamber, and the other end extending into the upper chamber, wherein the second gas isolation plate is spaced from the first gas isolation plate by a distance;
a third gas isolation plate, having one end connected to one end of the first gas isolation plate away from the inner wall of the reaction chamber, and the other end connected to one end of the second gas isolation plate away from the inner wall of the reaction chamber, wherein
the height of the first gas isolation plate, the height of the second gas isolation plate, and the height of the third gas isolation plate are all the same as the distance from an upper surface of the gas introduction device to the top of the reaction chamber.

Optionally, the gas isolation structure comprises an arc-shaped gas isolation plate, wherein two ends of the arc-shaped gas isolation plate are connected to the interior of the reaction chamber, and the height of the arc-shaped gas isolation plate is the same as the distance from the upper surface of the gas introduction device to the top of the reaction chamber.

Optionally, the high-throughput vapor deposition apparatus further includes:
an isolation gas supply system, which is connected to the isolation gas introduction channel, and used to supply an isolation gas into the isolation gas chamber; and
a reaction gas supply system, which is connected to the reaction gas introduction channel, and used to supply a reaction gas into the reaction gas chamber.

Optionally, the high-throughput vapor deposition apparatus also includes a real-time measurement device, which is used to characterize the element composition, film thickness, and microstructure etc. of a film deposited on an upper surface of the substrate, and where an active end of the real-time measurement device is located in the reaction chamber, and between the rotary workbench and the gas introduction device.

The present invention also provides a vapor deposition method, which includes the following steps:
1) providing a high-throughput vapor deposition apparatus as described in any of the above solutions;

2) introducing an isolation gas into the isolation gas chamber via the isolation gas introduction channel, and introducing a reaction gas into the reaction gas chamber via the reaction gas introduction channel, for carrying out thin film deposition on an area of the substrate corresponding to the reaction gas chamber;
3) driving the substrate by the rotary workbench to rotate by a preset angle, so that an area of the substrate where thin film deposition is not carried out is rotated to directly below the reaction gas chamber, for carrying out thin film deposition on this area of the substrate corresponding to the reaction gas chamber; and
4) repeating step 3) at least once, to carry out thin film deposition on a plurality of different areas of the substrate respectively.

As described above, the high-throughput vapor deposition apparatus and vapor deposition method of the present invention have the following beneficial effects.

The high-throughput vapor deposition apparatus of the present invention only requires one isolation gas supply system and one reaction gas isolation system, a total of two systems, and thus is simple in structure, easy to implement, and good in isolation. The high-throughput vapor deposition apparatus of the present invention has high degree of integration, in which other devices, for example, a real-time measurement device, can be integrated so that the function is more complete.

Figure 1:
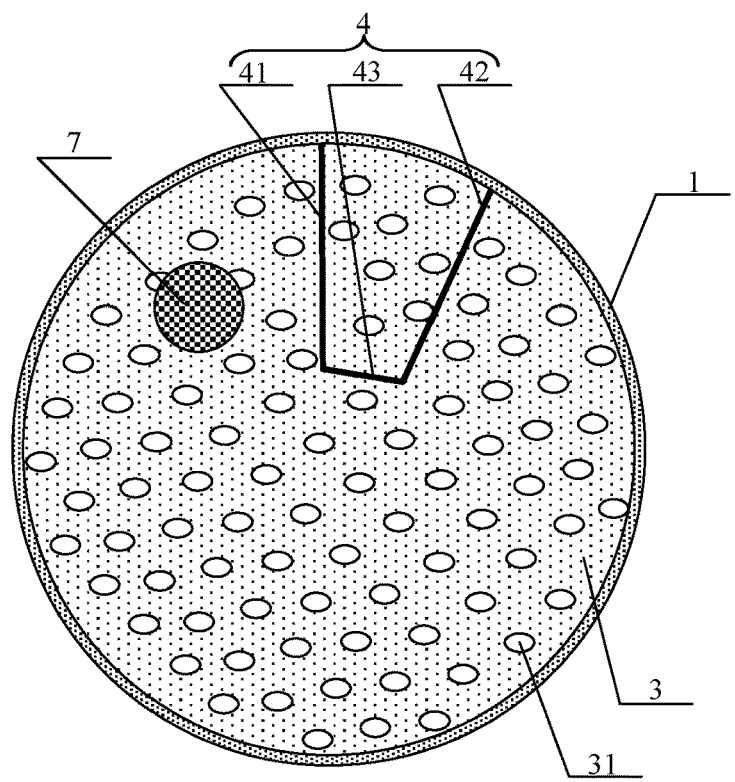
FIG. 1 is a schematic top view of a high-throughput vapor deposition apparatus provided in Embodiment 1 of the present invention.

REFERENCE NUMERALS 1 reaction chamber
11 upper chamber
111 isolation gas chamber
112 reaction gas chamber
12 lower chamber
2 rotary workbench
3 gas introduction device
31 through holes
4 gas isolation structure
41 first gas isolation plate
42 second gas isolation plate
43 third gas isolation plate
5 isolation gas introduction channel
6 reaction gas introduction channel
7 real-time measurement device
81 first supply pipe
82 second supply pipe
83 third supply pipe
84 fourth supply pipe
85 fifth supply pipe
86 sixth supply pipe
87 seventh supply pipe
88 eighth supply pipe

DETAILED DESCRIPTION

The following describes embodiments of the present invention by using specific examples. A person skilled in the art may easily understand other advantages and effects of the present invention from the content disclosed in this specification.

Figure 2:
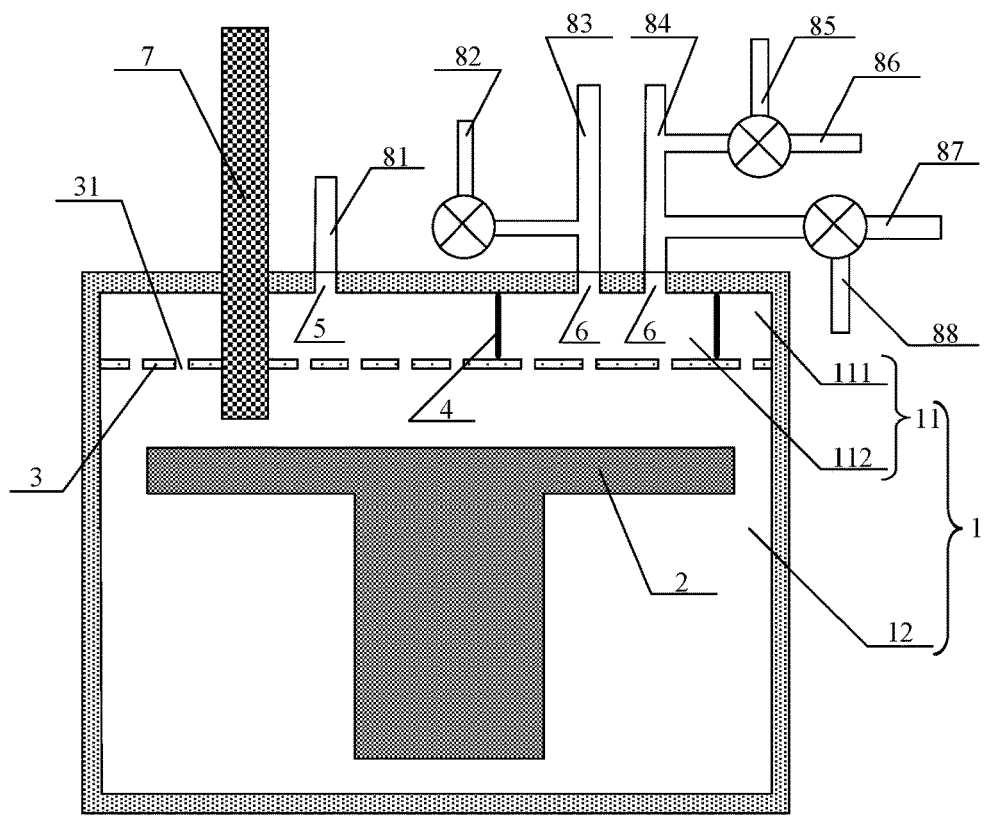
FIG. 2 is a schematic cross-sectional structural view of a high-throughput vapor deposition apparatus provided in Embodiment 1 of the present invention.
Figure 3:
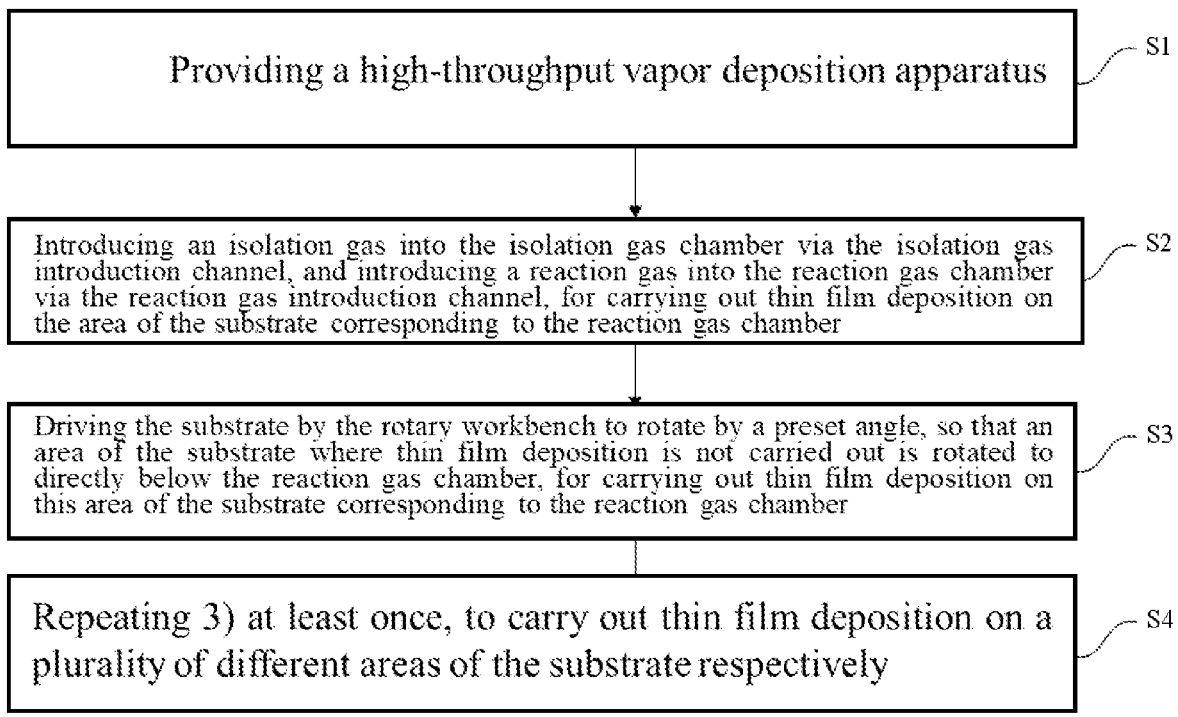
FIG. 3 shows a flowchart of a vapor deposition method provided in Embodiment 2 of the present invention.

Referring to FIG. 1 to FIG. 3, it should be understood that all the structures, proportions, sizes, and the like depicted in the accompanying drawings of this specification are merely used for matching the content disclosed in this specification, for those skilled in the art to learn and read, but are not intended to limit restraint conditions under which the present invention can be implemented, therefore having no substantial meaning technically. Any modification of the structures, change of proportion relationships, or adjustment of the sizes shall fall within the scope of the technical content disclosed in the present invention without affecting the effects that can be generated and the objectives that can be achieved through the present invention. In addition, the terms such as "upper", "lower', "left", "right", "middle", and "a/an" mentioned in this specification are also merely for facilitating clear descriptions, but are not intended to limit the scope of implementation of the present invention. Without substantially changing the technical contents, changes or adjustments of relative relationships thereof should also fall within the scope of implementation of the present invention.

Embodiment 1

Referring to FIGS. 1 and 2, the present invention provides a high-throughput vapor deposition apparatus. The high-throughput vapor deposition apparatus includes: a reaction chamber 1; a rotary workbench 2, which is located in the reaction chamber 1, used to support a substrate (not shown) and drive the substrate to rotate; a gas introduction device 3, which is located in the reaction chamber 1 and above the rotary workbench 2, and spaced from the rotary workbench 2 by a distance, wherein the gas introduction device 3 divides the reaction chamber 1 into an upper chamber 11 and a lower chamber 12, and a plurality of through holes 31 is provided on the gas introduction device 3, where the through holes 31 bring the upper chamber 11 and the lower chamber 12 into communication; a gas isolation structure 4, which is located in the upper chamber 11, and divides the upper chamber 11 into an isolation gas chamber 111 and a reaction gas chamber 112 which are isolated from each other, wherein a center of the gas introduction device 3 is located outside the reaction gas chamber 112, and the plurality of through holes 31 respectively allows the isolation gas chamber 111 and the reaction gas chamber 112 to communicate with the lower chamber 12; an isolation gas introduction channel 5, which is located on a wall of the reaction chamber 1, and communicates with the isolation gas chamber 111; and a reaction gas introduction channel 6, which is located on a wall of the reaction chamber 1, and communicates with the reaction gas chamber 112. The high-throughput vapor deposition apparatus of the present invention only requires one isolation gas supply system and one reaction gas isolation system, a total of two systems, and thus is simple in structure, easy to implement, and good in isolation. The high-throughput vapor deposition apparatus of the present invention has high degree of integration, in which other devices, for example, a real-time measurement device, can be integrated so that the function is more complete.

For example, the rotary workbench 2 is connected to a driving device (not shown), and the rotary workbench 2 is driven by the driving device to rotate when in needs.

In an embodiment, the plurality of through holes 31 can be evenly distributed on the gas introduction device 3.

In another embodiment, the distribution density of the through holes 31 corresponding to an area of the isolation gas chamber 111 where is adjacent to the reaction gas chamber 112 is greater than that corresponding to other areas of the isolation gas chamber 111. The distribution density of the through holes 31 corresponding to an area of the isolation gas chamber 111 where is adjacent to the reaction gas chamber 112 allows the isolation gas to form a gas curtain with better isolation effect, thus preventing the deposition of the reaction gas in other areas of the substrate.

For example, the shape and size of the gas introduction device 3 are the same as the internal shape and size of the reaction chamber 1, so that the sides of the gas introduction device 3 are in contact with the inner walls of the reaction chamber 1, to ensure that the upper chamber 11 and the lower chamber 12 communicate only through the through holes 31.

For example, the area of the reaction gas chamber 112 at the bottom is smaller than the area of the isolation gas chamber 111 at the bottom.

For example, the center of the gas introduction device 3 corresponds to the center of the rotary workbench 2 in a vertical direction. Since the center of the gas introduction device 3 is located outside the reaction gas chamber 112 and the center of the gas introduction device 3 corresponds to the center of the rotary workbench 2 in a vertical direction, the rotary workbench can be rotated to perform thin film deposition in different areas of the substrate when thin film deposition is carried out.

In an embodiment, referring to FIG. 1 again, the gas isolation structure 4 includes: a first gas isolation plate 41, which has one end in contact with an inner wall of the reaction chamber 1, and the other end extending into the upper chamber 11; a second gas isolation plate 42, which has one end in contact with an inner wall of the reaction chamber 1, and the other end extending into the upper chamber 11, wherein the second gas isolation plate 42 is spaced from the first gas isolation plate 41 by a distance; and a third gas isolation plate 43, which has one end connected to one end of the first gas isolation plate 41 away from the inner wall of the reaction chamber 1, and the other end connected to one end of the second gas isolation plate 42 away from the inner wall of the reaction chamber 1, wherein the height of the first gas isolation plate 41, the height of the second gas isolation plate 42 and the height of the third gas isolation plate 43 are all the same as the distance from an upper surface of the gas introduction device 3 to the top of the reaction chamber 1.

In another embodiment, the gas isolation structure 4 includes an arc-shaped gas isolation plate (not shown), whose two ends are both connected to the interior of the reaction chamber 1, and the height of the arc-shaped gas isolation plate is the same as the distance from the upper surface of the gas introduction device 3 to the top of the reaction chamber 1.

For example, the high-throughput vapor deposition apparatus may further include an isolation gas supply system (not shown), which is connected to the isolation gas introduction channel 5, and used to supply an isolation gas to the isolation gas chamber 111; and a reaction gas supply system (not shown), which is connected to the reaction gas introduction channel 6, and used to supply a reaction gas into the reaction gas chamber 112.

For example, the isolation gas supply system can include an isolation gas source (not shown) and a first supply pipe 81. The first supply pipe 81 has one end connected to the isolation gas source, and the other end connected to the isolation gas introduction channel 5. The isolation gas provided by the isolation gas supply system to the isolation gas chamber 111 may include, but is not limited to, argon (Ar).

For example, the reaction gas supply system may include a carrier gas source (not shown), a precursor source (not shown), a reaction gas source, a second supply pipe 82, a third supply pipe 83, a fourth supply pipe 84, a sixth supply pipe 86, a seventh supply pipe 87, and an eighth supply pipe 88. One end of both the third supply pipe 83 and the fourth supply pipe 84 is connected to the carrier gas source, and the other end is connected to the reaction gas introduction channel 6. One end of the second supply pipe is connected to the reaction gas source, and the other end communicates with the third supply pipe 83. One end of the sixth supply pipe 86 is connected to the precursor source, and the other end communicates with the fourth supply pipe 84. One end of the fifth supply pipe 85 is connected to the carrier gas source, and the other end communicates with the sixth supply pipe 86. One end of the seventh supply pipe 87 is connected to another carrier gas source, and the other end communicates with the fourth supply pipe 84. One end of the eighth supply pipe 88 is connected to the carrier gas source, and the other end communicates with the seventh supply pipe 87. The reaction gas supply system is used to supply the reaction gas and the reaction precursor to the reaction gas chamber 112 with the assistance of the carrier gas.

For example, the high-throughput vapor deposition apparatus further includes a real-time measurement device 7. The real-time measurement device 7 is used to characterize, without limitation, the element composition, film thickness, and microstructure of a film deposited on an upper surface of the substrate, wherein an active end of the real-time measurement device 7 is located in the reaction chamber 1, and between the rotary workbench 2 and the gas introduction device 3. Specifically, the real-time measurement device 7 may include, but is not limited to, an Auger Electron Spectrometer (AES).

The working principle of the high-throughput vapor deposition apparatus in this embodiment is as follows. A first deposition area of the substrate is driven by the rotary workbench 2 to rotate to right below the reaction gas chamber 112. The reaction gas supply system provides the reaction gas and the reaction precursor to the reaction gas chamber 112, and the isolation gas supply system provides the isolation gas to the isolation gas chamber 111 at the same time. The isolation gas enters the lower chamber 12 through the through holes 31 to form an isolation gas curtain. The reaction gas and the reaction precursor enter the lower chamber 12 through the through holes 31. Due to the barrier of the gas curtain formed by the insulation gas, the reaction gas and the reaction precursor can only undergo thin film deposition in the first deposition area of the substrate that is located right under the reaction gas chamber 112. After the thin film deposition in the first deposition area is completed, a second deposition area of the substrate is driven by the rotary workbench 2 to rotate to right below the reaction gas chamber 112 for carrying out thin film deposition in the second deposition area. The above steps are repeated, until the thin film deposition process is completed. In this way, thin film deposition can be performed in different areas of the substrate.

The high-throughput vapor deposition apparatus of the present invention only requires one isolation gas supply system and one reaction gas isolation system, a total of two systems, and thus is simple in structure, easy to implement, and good in isolation. The high-throughput vapor deposition apparatus of the present invention has high degree of integration, in which other devices, for example, a real-time measurement device, can be integrated so that the function is more complete.

Embodiment 2

Referring to FIG. 3 in connection with FIGS. 1 and 2, the present invention provides a vapor deposition method, which includes the following steps:

1) providing a high-throughput vapor deposition apparatus as described in embodiment 1;
2) introducing an isolation gas into the isolation gas chamber via the isolation gas introduction channel, and introducing a reaction gas into the reaction gas chamber via the reaction gas introduction channel, for carrying out thin film deposition on the area of the substrate corresponding to the reaction gas chamber; and
3) driving the substrate by the rotary workbench to rotate by a preset angle, so that an area of the substrate where thin film deposition is not carried out is rotated to directly below the reaction gas chamber, for carrying out thin film deposition on this area of the substrate corresponding to the reaction gas chamber; and
4) repeating step 3) at least once, to carry out thin film deposition on a plurality of different areas of the substrate respectively.

In Step 1), referring to S1 in FIG. 3 in connection with FIGS. 1 and 2, a high-throughput vapor deposition apparatus as described in embodiment 1 is provided. Specific structure of the high-throughput vapor deposition apparatus can be made reference in Embodiment 1, and is not repeated here again.

In Step 2), Referring to FIG. 3 in connection with FIGS. 1 and 2, an isolation gas is introduced into the isolation gas chamber 111 via the isolation gas introduction channel 5, and a reaction gas is introduced into the reaction gas chamber 112 via the reaction gas introduction channel 6, for carrying out thin film deposition on an area of the substrate corresponding to the reaction gas chamber 112 (for example, the first deposition area in Embodiment 1).

It should be noted that when the reaction gas is introduced into the reaction gas chamber 112, a reaction precursor can also be introduced into the reaction gas chamber 112 at the same time.

Specifically, the isolation gas introduced into the isolation gas chamber 111 enters the lower chamber 12 via the through holes 31 to form a gas curtain, and the reaction gas and the reaction precursor enter the lower chamber 12 through the through holes 31. Due to the barrier of the gas curtain formed by the insulation gas, the reaction gas and the reaction precursor can only undergo thin film deposition in an area of the substrate that is located right under the reaction gas chamber 112.

In Step 3), referring to S3 in FIG. 3 in connection with FIGS. 1 and 2, the substrate is driven by the rotary workbench 2 to rotate by a preset angle, so that an area of the substrate where thin film deposition is not carried out (such as a second deposition area in Embodiment 1) is rotated to directly below the reaction gas chamber 112, for carrying out thin film deposition on the area of a substrate corresponding to the reaction gas chamber 112.

In Step 4), referring to S4 in FIG. 3 in connection with FIGS. 1 and 2, Step 3) is repeated at least once, to carry out thin film deposition on a plurality of different areas of the substrate respectively.

In summary, the present invention provides a high-throughput vapor deposition apparatus and a vapor deposition method. The high-throughput vapor deposition apparatus includes: a reaction chamber; a rotary workbench, located in the reaction chamber and used to support a substrate and drive the substrate to rotate; a gas introduction device, located in the reaction chamber and above the rotary workbench, and spaced from the rotary workbench by a distance, wherein the gas introduction device divides the reaction chamber into an upper chamber and a lower chamber, and a plurality of through holes is provided on the gas introduction device, and the through holes bring the upper chamber and the lower chamber into communication; a gas isolation structure, located in the upper chamber, and dividing the upper chamber into an isolation gas chamber and a reaction gas chamber which are isolated from each other, wherein a center of the gas introduction device is located outside the reaction gas chamber, and the plurality of through holes respectively allows the isolation gas chamber and the reaction gas chamber to communicate with the lower chamber; an isolation gas introduction channel, located on a wall of the reaction chamber and communicating with the isolation gas chamber; and a reaction gas introduction channel, located on a wall of the reaction chamber and communicating with the reaction gas chamber. The high-throughput vapor deposition apparatus of the present invention only requires one isolation gas supply system and one reaction gas isolation system, a total of two systems, and thus is simple in structure, easy to implement, and good in isolation. The high-throughput vapor deposition apparatus of the present invention has high degree of integration, in which other devices, for example, a real-time measurement device, can be integrated so that the function is more complete.

The above embodiments only exemplarily illustrate the principles and effects of the present invention, but are not used to limit the present invention. Any person skilled in the art may make modifications or changes on the foregoing embodiments without departing from the spirit and scope of the present invention. Therefore, all equivalent modifications or changes made by a person of ordinary skill in the art without departing from the spirit and technical idea of the present invention shall be covered by the claims of the present invention.

What is claimed is:

1. A vapor deposition apparatus, comprising:
   a reaction chamber;
   a rotary workbench, located in the reaction chamber and used to support a substrate and drive the substrate to rotate;
   a gas introduction device, located in the reaction chamber and above the rotary workbench, and spaced from the rotary workbench by a distance, wherein the gas introduction device divides the reaction chamber into an upper chamber and a lower chamber, and a plurality of through holes is provided on the gas introduction device to bring the upper chamber and the lower chamber into communication;
   a gas isolation structure, located in the upper chamber, and dividing the upper chamber into an isolation gas chamber and a reaction gas chamber which are isolated from each other, wherein a center of the gas introduction device is located outside the reaction gas chamber, and the plurality of through holes respectively allows the isolation gas chamber and the reaction gas chamber to communicate with the lower chamber; wherein the gas isolation structure comprises a first gas isolation plate, a second gas isolation plate, and a third gas isolation plate; wherein one end of the first gas isolation plate is in contact with an inner wall of the reaction chamber, and the other end of the first gas isolation plate is extended into the upper chamber; wherein one end of the second gas isolation plate is in contact with an inner wall of the reaction chamber, and the other end of the second gas isolation plate is extended into the upper chamber; wherein the second gas isolation plate is spaced from the first gas isolation plate by a distance; wherein one end of the third gas isolation plate is connected to one end of the first gas isolation plate away from the inner wall of the reaction chamber, and the other end of the third gas isolation plate is connected to one end of the second gas isolation plate away from the inner wall of the reaction chamber, wherein the reaction gas chamber is formed by the first gas isolation plate, the second gas isolation plate, the third gas isolation plate, and the inner wall of the reaction chamber;

an isolation gas introduction channel, located on a wall of the reaction chamber and communicating with the isolation gas chamber;

a reaction gas introduction channel, located on a wall of the reaction chamber and communicating with the reaction gas chamber;

an isolation gas supply system, connected to the isolation gas introduction channel, and used to supply an isolation gas into the isolation gas chamber, wherein the isolation gas enters the lower chamber through the plurality of through holes to form an isolation gas curtain; and a reaction gas supply system, connected to the reaction gas introduction channel, and used to supply a reaction gas into the reaction gas chamber;

wherein the gas isolation structure is configured such that the reaction gas undergoes thin film deposition only in a first deposition area of the substrate that is located right under the reaction gas chamber;

wherein a distribution density of the plurality of through holes corresponding to an area of the isolation gas chamber adjacent to the reaction gas chamber is greater than that corresponding to other areas of the isolation gas chamber.

2. The vapor deposition apparatus according to claim 1, wherein the area of the reaction gas chamber at the bottom is smaller than the area of the isolation gas chamber at the bottom.

3. The vapor deposition apparatus according to claim 1, wherein the center of the gas introduction device corresponds to the center of the rotary workbench in a vertical direction.

4. The vapor deposition apparatus according to claim 1, wherein the height of the first gas isolation plate, the height of the second gas isolation plate, and the height of the third gas isolation plate are all the same as the distance from an upper surface of the gas introduction device to the top of the reaction chamber.

5. The vapor deposition apparatus according to claim 1, wherein the gas isolation structure comprises an arc-shaped gas isolation plate, wherein two ends of the arc-shaped gas isolation plate are connected to the interior of the reaction chamber, and the height of the arc-shaped gas isolation plate is the same as the distance from the upper surface of the gas introduction device to the top of the reaction chamber.

6. The vapor deposition apparatus according to claim 1, further comprising a real-time measurement device, used to characterize properties comprising the element composition, film thickness, and microstructure of a film deposited on an upper surface of the substrate, wherein an active end of the real-time measurement device is located in the reaction chamber, and between the rotary workbench and the gas introduction device.

7. A vapor deposition method, comprising:
  1) providing a high-throughput vapor deposition apparatus according to claim 1;
  2) Introducing an isolation gas into the isolation gas chamber via the isolation gas introduction channel, and introducing a reaction gas into the reaction gas chamber via the reaction gas introduction channel, for carrying out thin film deposition on the area of the substrate corresponding to the reaction gas chamber; and
  3) Driving the substrate by the rotary workbench to rotate by a preset angle, so that an area of the substrate where thin film deposition is not carried out is rotated to directly below the reaction gas chamber, for carrying out thin film deposition on this area of the substrate corresponding to the reaction gas chamber; and
  4) Repeating 3) at least once, to carry out thin film deposition on a plurality of different areas of the substrate respectively.

* * * * *